United States Patent
Esler et al.

(10) Patent No.: US 11,328,973 B2
(45) Date of Patent: May 10, 2022

(54) POWER SEMICONDUCTOR DEVICES WITH HIGH TEMPERATURE ELECTRICAL INSULATION

(71) Applicant: GENERAL ELECTRIC COMPANY, Schenectady, NY (US)

(72) Inventors: David Richard Esler, Gloversville, NY (US); Emad A. Andarawis, Ballston Lake, NY (US)

(73) Assignee: General Electric Company, Schenectady, NY (US)

( * ) Notice: Subject to any disclaimer, the term of this patent is extended or adjusted under 35 U.S.C. 154(b) by 34 days.

(21) Appl. No.: 16/912,890

(22) Filed: Jun. 26, 2020

(65) Prior Publication Data

US 2021/0407878 A1  Dec. 30, 2021

(51) Int. Cl.
 *H01L 23/31* (2006.01)
 *H01L 21/56* (2006.01)
 *H01L 23/29* (2006.01)

(52) U.S. Cl.
 CPC .......... *H01L 23/3171* (2013.01); *H01L 21/56* (2013.01); *H01L 23/291* (2013.01); *H01L 23/3192* (2013.01)

(58) Field of Classification Search
 CPC ... H01L 23/3171; H01L 21/56; H01L 23/291; H01L 23/3192
 See application file for complete search history.

(56) References Cited

U.S. PATENT DOCUMENTS

| | | | |
|---|---|---|---|
| 6,620,739 B1 | 9/2003 | Yoshitaka et al. | |
| 8,803,296 B2 | 8/2014 | Morrison et al. | |
| 9,460,937 B2 | 10/2016 | Son et al. | |
| 10,163,773 B1 | 12/2018 | Kapusta et al. | |
| 10,373,929 B2 | 8/2019 | Kurita | |
| 2004/0070059 A1* | 4/2004 | Hori | H01L 23/49562 257/678 |
| 2006/0115995 A1 | 6/2006 | Yan-Ming | |
| 2019/0080976 A1* | 3/2019 | Kudou | H01L 29/7802 |
| 2019/0148279 A1 | 5/2019 | Kapusta et al. | |
| 2019/0267331 A1* | 8/2019 | Hatanaka | H01L 25/07 |
| 2020/0066652 A1 | 2/2020 | Kapusta et al. | |
| 2020/0227339 A1* | 7/2020 | Schwab | H01L 23/49568 |
| 2020/0381370 A1* | 12/2020 | Pfefferlein | H01L 24/24 |
| 2020/0411400 A1* | 12/2020 | Riedl | H01L 21/56 |
| 2021/0166986 A1* | 6/2021 | Roth | H01L 21/565 |

* cited by examiner

*Primary Examiner* — Nicholas J Tobergte
(74) *Attorney, Agent, or Firm* — Dinsmore & Shohl LLP (57) ABSTRACT

A device comprises: a high temperature semiconductor device comprising a first surface, wherein the high temperature semiconductor device comprises an active area and a termination area disposed adjacent to the active area; an inorganic dielectric insulating layer disposed on the first surface, wherein the inorganic dielectric insulating layer fills a volume extending over an entirety of the termination area and comprises a thickness greater than or equal to 25 μm and less than or equal to 500 μm; and an electrical connector connecting the active area of the high temperature semiconductor device to an additional component of the device.

19 Claims, 7 Drawing Sheets

POWER SEMICONDUCTOR DEVICES WITH HIGH TEMPERATURE ELECTRICAL INSULATION

BACKGROUND

Field

The present specification generally relates to high temperature semiconductor electronics and, more particularly, to device level insulation for high temperature semiconductor electronics.

Technical Background

Wide bandgap semiconductors beneficially possess the capabilities to process electric power at higher voltage and temperature with smaller die areas than conventional silicon-based devices. To maximize the efficiency of such wide bandgap devices, device size at the wafer level is minimized to reduce the cost of manufacturing and to improve the power efficiency by controlling critical device parameters, such as device-level resistance.

Such minimization necessitates insulation of such wide bandgap semiconductor devices because the potential for voltage breakdown exists when operating at high voltages. Current systems typically comprise bulk insulation that encapsulate wide bandgap semiconductor devices such that the insulation covers both the high and low voltage areas of the devices. Such insulation methods suffer from several deficiencies. For example, some bulk insulation materials (e.g., organic materials such as polyimide-based insulation) are incapable of sustained operation at temperatures greater than 200° C. because such materials may sublimate, burn, delaminate, or form voids that degrade electrical performance. Complete encapsulation of the device in the bulk insulation also has drawbacks as the coefficients of thermal expansion of the insulation and the other components of the device (e.g., a packaging substrate) may significantly differ, leading to significant stresses during thermal cycling and eventual cracking of the insulation and therefore reduced performance.

Accordingly, an alternative scheme for insulating wide bandgap semiconductor devices is needed, especially for operating such devices at temperatures of 200° C. or more.

SUMMARY

Various embodiments disclosed herein meet these needs by providing an inorganic dielectric insulating layer locally onto a surface of a semiconductor device as a separate element to the device. Such an inorganic dielectric insulating layer covers a high voltage region adjacent to the surface of the semiconductor to prevent voltage breakdown while providing durability in high temperature uses. Additional features and advantages will be described in greater detail below.

According embodiments disclosed herein, a device comprises: a high temperature semiconductor device comprising a first surface, wherein the high temperature semiconductor device comprises an active area and a termination area disposed adjacent to the active area; an inorganic dielectric insulating layer disposed on the first surface, wherein the inorganic dielectric insulating layer fills a volume extending over an entirety of the termination area and comprises a thickness greater than or equal to 25 µm and less than or equal to 500 µm; and an electrical connector connecting the active area of the high temperature semiconductor device to an additional component of the device.

According to additional embodiments herein, a device comprises a high temperature semiconductor device comprising a first surface; a high voltage region disposed adjacent to the first surface; a low voltage region disposed adjacent to the first surface and offset from the high voltage region; and an inorganic dielectric insulating layer disposed on the first surface in the high voltage region, wherein the first surface has a width in a direction perpendicular to a surface normal of the first surface, wherein the inorganic dielectric insulating layer comprises a portion that extends over a circumferential edge of the first surface, wherein the portion is less than or equal to a quarter of the width of the first surface.

According additional embodiments disclosed herein, a method comprises: depositing an inorganic dielectric insulating layer on a pre-formed high temperature semiconductor device, wherein: the high temperature semiconductor device comprises a first surface; the high temperature semiconductor device comprises an active area and a termination area disposed adjacent to the active area; the inorganic dielectric insulating layer is deposed on the first surface such that the inorganic dielectric insulating layer overlaps the termination area; and the inorganic dielectric insulating layer comprises a dielectric strength of greater than or equal to 10 kV/mm and less than or equal to 35 kV/mm.

Additional features and advantages of the processes and systems described herein will be set forth in the detailed description which follows, and in part will be readily apparent to those skilled in the art from that description or recognized by practicing the embodiments described herein, comprising the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are comprised to provide a further understanding of the various embodiments, and are incorporated into and constitute a part of this specification. The drawings illustrate the various embodiments described herein, and together with the description serve to explain the principles and operations of the claimed subject matter.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Reference will now be made in detail to embodiments of inorganic dielectric insulation for a high temperature semiconductor device. The high temperature semiconductor device may be formed on a wide bandgap semiconductor substrate via wafer processing techniques and comprise a first surface. The high temperature semiconductor device may comprise an active region and a termination region. Operation of the high temperature semiconductor device may result in the generation of relatively high electric fields in a high voltage region disposed proximate to the termination region. An inorganic dielectric insulating material is locally disposed on the first surface so as to extend through the high voltage region to prevent a voltage breakdown of the high temperature semiconductor device. Various embodiments of semiconductor devices and method for forming the same will be described herein with specific reference to the appended drawings.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the specific value or end-point referred to is comprised. Whether or not a numerical value or end-point of a range in the specification recites "about," two embodiments are described: one modified by "about," and one not modified by "about." It will be further understood that the endpoints of each of the ranges are significant both in relation to the other endpoint, and independently of the other endpoint.

Directional terms as used herein—for example up, down, right, left, front, back, top, bottom—are made only with reference to the figures as drawn and are not intended to imply absolute orientation.

Unless otherwise expressly stated, it is in no way intended that any method set forth herein be construed as requiring that its steps be performed in a specific order, nor that with any apparatus specific orientations be required. Accordingly, where a method claim does not actually recite an order to be followed by its steps, or that any apparatus claim does not actually recite an order or orientation to individual components, or it is not otherwise specifically stated in the claims or description that the steps are to be limited to a specific order, or that a specific order or orientation to components of an apparatus is not recited, it is in no way intended that an order or orientation be inferred, in any respect. This holds for any possible non-express basis for interpretation, comprising: matters of logic with respect to arrangement of steps, operational flow, order of components, or orientation of components; plain meaning derived from grammatical organization or punctuation, and; the number or type of embodiments described in the specification.

As used herein, the singular forms "a," "an" and "the" comprise plural referents unless the context clearly dictates otherwise. Thus, for example, reference to "a" component comprises aspects having two or more such components, unless the context clearly indicates otherwise.

The methods and devices described herein involve application of an inorganic dielectric insulating material locally to the first surface of the high temperature semiconductor device after formation of the high temperature semiconductor device. As used herein, the term "locally" generally means that the extension of the inorganic dielectric insulating material to other components removed from the first surface (e.g., wire bonds, external packaging, etc.) is generally minimized. Such localized application of the inorganic dielectric insulating material beneficially enhances the temperature capabilities of the high temperature semiconductor device by minimizing overlap between thermally incompatible materials (e.g., the external packaging and the inorganic dielectric insulating material may possess significantly different coefficients of thermal expansion, inducing cracks upon thermal cycling).

The inorganic dielectric insulating material may comprise a material capable of repeated thermal cycling to temperatures greater than 200° C. For example, in various embodiments, the component is a cement (e.g., a calcium aluminate cement, a phosphate cement), ceramic (e.g., an aluminum phosphate ceramic), glass, or composite that does not burn or sublimate at temperatures of up to 500° C. or more. As such, the devices and methods described herein facilitate long-term operation of high temperature semiconductor devices at temperatures up to 500° C. and having operating voltages of 1000V or more. These improvements expand the capabilities of high power semiconductor devices to more extreme environments, such as electric actuation and power conversion at such elevated temperatures. Applications of the improvements to the semiconductor devices described herein include down hole drilling, core-mounted actuation in aircraft engines, and electrical submersible pumps for oil and gas. Additionally, the improved semiconductor devices described herein are also generally applicable to systems with minimal room for a thermal management system or for passively cooled systems. For example, the improved semiconductor devices described herein may find use in electric and hybrid-electric vehicles with relatively high-temperature cooling systems or wider operating temperature allowances in the cooling system (e.g., having surge temperatures of 250° C. or 300° C.)

As used herein, the term "semiconductor device" refers to a semiconductor component, device, die or chip that performs specific functions such as a power transistor, power diode, analog amplifier, or RF element, as non-limiting examples. Typical semiconductor devices comprise input/output (I/O) interconnections, referred to herein as contacts or contact pads, which are used to connect the semiconductor device to external circuitry and are electrically coupled to internal elements within the semiconductor device. The semiconductor devices described herein may be power semiconductor devices used as electrically controllable switches or rectifiers in power electronic circuits, such as switched mode power supplies, for example. Non-limiting examples of power semiconductor devices comprise insulated avalanche photodiodes (APDs), gate bipolar transistors (IG- BTs), metal oxide semiconductor field effect transistors (MOSFETs), high electron mobility transistor HEMTs, field effect transistors (FETs), PIN diode, Schottky diode, bipolar junction transistors (BJTs), integrated gate-commutated thyristors (IGCTs), TVS, Zener, gate turn-off (GTO) thyristors, Silicon Controlled Rectifiers (SCRs), diodes or other devices or combinations of devices. Semiconductor devices may also be digital logic devices, such as a microprocessor, microcontroller, memory device, video processor, or an Application Specific Integrated Circuit (ASIC), as non-limiting examples. The semiconductor devices described herein may also include various doping configurations, such as N type or P type doping. Additionally the semiconductor devices may have any layer structure (e.g., vertical layers, lateral layers, etc.).

As used herein, "semiconductor substrate" refers to a substrate upon which the semiconductors described herein are formed. Examples of "semiconductor substrates" comprise substrates formed from Silicon, Silicon on insulator (SOI), diamond, Silicon Carbide (SiC), Gallium Nitride (GaN), Aluminum Gallium Nitride (AlGaN), Gallium Oxide (GaO), Boron nitride (BN), Aluminum Nitride (AlN), and silicon dioxide ($SiO_2$) and Gallium Arsenide (GaAs). Some embodiments herein include a wide bandgap semiconductor substrate having a bandgap greater than silicon.

As used herein, the phrase "high temperature" refers to an elevated operating temperature for a semiconductor device. Such an elevated operating temperature may be 200° C. or more, less than or equal to 500° C., less than or equal to 800° C., or even less than or equal to 1000° C. in various embodiments. It should be appreciated that such elevated operating temperatures may result from temperature fluctuations in the environment of the semiconductor device, such that the operating temperature may not consistently be so elevated.

Figure 1:
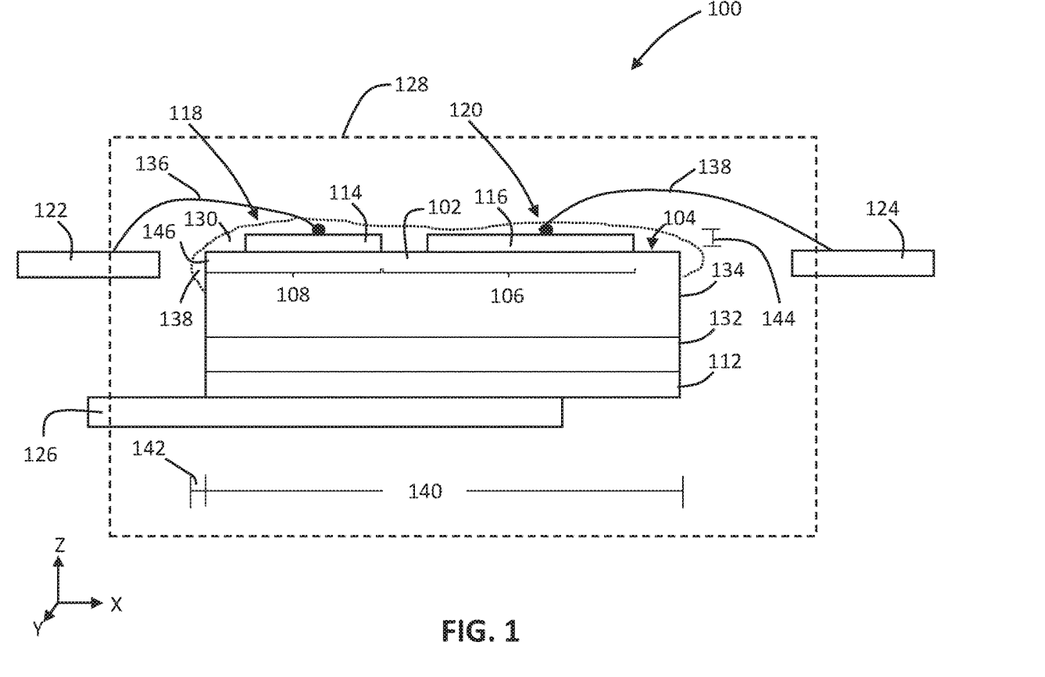
FIG. 1 schematically depicts a power device comprising an inorganic dielectric insulating layer, according to one or more embodiments described herein.

Referring to FIG. 1, a schematic of a power device 100 is shown, according to one or more embodiments herein. The power device 100 comprises a high temperature semiconductor device 102 comprising a first surface 104. The high temperature semiconductor device 102 may comprise a device layer 134 formed on a semiconductor substrate 132. In some embodiments, the semiconductor substrate 132 comprises a wide bandgap semiconductor substrate. The high temperature semiconductor device 102 may take a number of forms depending on the implementation. For example, in some embodiments, the high temperature semiconductor device 102 comprises a metal oxide semiconductor field effect transistor (MOSFET). Additionally, it should be appreciated that numerous elements of the device layer 134 have been omitted for the purposes of discussion herein. For example, in some embodiments, the device layer 134 may comprise a drift region having a first conductivity type (e.g., n-type) and a well region disposed proximate to the first surface 104 having a second conductivity type (e.g., p-type). Proximate to the first surface 104 the device layer 134 may comprise a source region having the first conductivity type, establishing a p-n junction proximate to the first surface 104. As described herein, the first surface 104 of the high temperature semiconductor device 102 comprises a boundary surface of the device layer 134, as well as any additional components of the high temperature semiconductor device 102 disposed on the device layer 134 during wafer fabrication of the high temperature semiconductor device 102.

High temperature semiconductor device 102 is generally shown to comprise a high voltage region 118 and a low voltage region 120 proximate to the first surface 104. A limiting factor in terms of the operating voltage of the high temperature semiconductor device 102 is the breakdown voltage. The breakdown voltage limits a maximum voltage that a p-n junction in the device layer 134 can withstand. Excessively high electric fields may generally be present within the high voltage region 118 when the high temperature semiconductor device 102 is operating under certain conditions (e.g., reverse bias). In embodiments, the high voltage region 118 is a dipole possessing voltages of greater than or equal to 1000V. Each high voltage region 118 (e.g., each region immediately approximate to the first surface 104 near a p-n junction discontinuity) may have a length of greater than or equal to 50 µm and less than or equal to 300 µm. Generally, the high voltage region 118 coincides with a termination region 108 within the device layer 134. For example, termination region 108 may comprise discontinuities of a p-n junction within the device layer 134. The high temperature semiconductor device 102 may comprise various features to reduce the high concentration of electric fields causing voltage breakdown within the termination region 108. For example, in some embodiments, the termination region 108 may comprise a junction termination extension (JTE) region. The low voltage region 120 is generally offset from such junction terminations and may generally overlap an active region 106 of the high temperature semiconductor device 102.

The high temperature semiconductor device 102 comprises a source contact 116 disposed on a first portion of the device layer 134 (e.g., adjacent to a portion of the device layer 134 comprising a well region and a body region disposed adjacent to the well region) and a gate contact 114 disposed on a second portion of the device layer 134. A drain contact 112 may be disposed on a side of the semiconductor substrate 132 opposite to the device layer 134. During operation of the high temperature semiconductor device 102, a voltage may be applied via the gate contact 114 to create an inversion layer in the device layer 134 and cause a conductive path to form in an active region 106 of the device layer 134 proximate to the source contact 116. Such a conductive path may allow current to flow between the source contact 116 and the drain contact 112. It should be appreciated that the locations of gate contact 114 and source contact 116 are exemplary only and are completely dependent on the implementation of the high temperature semiconductor device 102. It should be appreciated that FIG. 1 illustrates an example configuration or layout of the drain contact 112, gate contact 114, and source contact 116, and the location, size, and shape of the drain contact 112, gate contact 114, and source contact 116 may vary in other embodiments. For example, in some embodiments, the source contact 116 and gate contact 114 may at least partially overlap with one another and may be electrically isolated from one another by one or more dielectric layers disposed between the source contact 116 and the gate contact 114. Alternatively or additionally, in some embodiments, the source contact 116 and gate contact 114 may extend through openings formed in insulating layers of the device layer 134.

In the example shown, the power device 100 comprises a lead frame 128 having a die pad 126 and leads 122 and 124. It should be appreciated that, while power device 100 is shown to comprise only a single high temperature semiconductor device 102, any number of semiconductor devices (e.g. two or more semiconductor devices) may be comprised depending on the implementation. The drain contact 112 is shown to be disposed on the die pad 126 (e.g., via a conductive adhesive) but, in other embodiments, the power device 100 may comprise a separate drain lead and the drain contact 112 may be connected thereto via a wire connection. Gate and source wires 136 and 138 are shown to extend between the gate contact 114 and the lead 122, and the source contact 116 and the lead 124, respectively. The gate and source wires 136 and 138 may be coupled to the gate and source contacts 114 and 116 by, for example, ball bonding, wedge bonding, compliant bonding, or any other method.

In various embodiments, the lead frame 128 may be disposed in an external packaging (not shown). Generally, such external packaging may be coupled to a power source and load, and the power device 100 may be used to perform various electronic functions depending on the implementation. For example, in one embodiment, the power device 100 may be a power converter configured to receive power from the power source and provide converted power to the load. It should be appreciated that the power device 100 may perform various functions depending on the implementation and that the power device 100 shown is only exemplary.

The size of the high temperature semiconductor device 102 may generally be minimized during fabrication. For example, in some embodiments, the high temperature semiconductor device 102 is fabricated to have a width 140 of 5 mm or less. Such minimization beneficially reduces fabrication costs and improves power conversion efficiency by controlling critical device parameters. For example, minimizing the size of the high temperature semiconductor device 102 may generally enhance power conversion efficiency by minimizing device-level resistance (e.g., in embodiments where the high temperature semiconductor device 102 is a MOSFET, the drain-to-source on-state resistance may be minimized). Such minimization, however, may render the high temperature semiconductor device 102 more susceptible to surface voltage breakdown in the high voltage region 118 because junction terminations within the device layer 134 are generally closer together than in embodiments where the semiconductor device 102 is larger.

The potential for voltage breakdown of high temperature semiconductor device 102 creates a need for insulating material within and/or around the high voltage region 118. Existing power devices may fulfill this need by encapsulating the high temperature semiconductor device 102 in a bulk insulation material at a packaging level. For example, in conventional devices, as a part of packaging the lead frame 128 within a device package, a bulk insulating material may be applied to an entirety of the lead frame such that the insulating material substantially surrounds an entirety of the high temperature semiconductor device 102, lead frame 128, leads 122 and 124, and die pad 126. There are several deficiencies with such insulation techniques. This is especially the case when operating the power device 100 at temperatures of 200° C. or more. In a first aspect, typical bulk insulating materials may comprise organic insulating materials (e.g., a polyimide-based insulators, epoxy molding compounds, silicone gel dielectrics) that may sublimate, burn, delaminate, or form voids when exposed to such temperatures, leading to degradation in electrical performance. In another aspect, encapsulating the high temperature semiconductor device 102 in insulating materials has other thermal drawbacks. For example, mismatches of coefficients of thermal expansion between the insulation and various components of the power device 100 (e.g., the die pad 126 or lead frame 128) may induce material stresses upon thermal cycling, leading to cracking of the insulating material and further degradation of electrical performance.

With the foregoing in mind, the power devices 100 described herein comprise an inorganic dielectric insulating layer 130 locally disposed on the first surface 104 of the high temperature semiconductor device 102. In various embodiments, the inorganic dielectric insulating layer 130 is disposed on the first surface 104 after formation of the high temperature semiconductor device 102 via wafer processing techniques. In other words, the inorganic dielectric insulating layer 130 is a separately formed component disposed on the first surface 104. Such separate formation of the dielectric insulating layer 130 facilitates the dielectric insulating layer 130 being tailored to the high temperature semiconductor device 102 (e.g., in terms of geometry, thickness, etc.) such that adequate insulation is provided while minimizing overlap between thermally incompatible materials. Typically, insulating layers incorporated into existing temperature semiconductor devices involve wafer-applied processes occurring at elevated temperatures (e.g., chemical vapour deposition, spin coating) that cannot support thicknesses over certain amounts without generating high stresses in the insulating layers. The present disclosure utilizes techniques to apply the inorganic dielectric insulating layer 130 that are separate from the wafer-applied techniques (e.g., application processes not occurring at the elevated temperatures associated with wafer-applied processes) such as additive manufacturing techniques to provide adequate thickness while still avoiding large residual stress in the inorganic dielectric insulating layer 130.

As shown in FIG. 1, the inorganic dielectric insulating layer 130 generally has a thickness 144 in relation to the first surface 104. While the inorganic dielectric insulating layer 130 may comprise portions 139 extending beyond an outer circumferential edge 146 of the first surface 104, generally, the inorganic dielectric insulating layer 130 extends into the high voltage region 118 by an amount coinciding with the thickness 144 in a direction of a surface normal of the first surface 104. In the example shown, the surface normal is in the z-direction, while the first surface 104 extends in the x-direction and the y-direction. In various embodiments, the thickness 144 is greater than or equal 25 μm and less than or equal to 500 μm. In another embodiment, the thickness 144 is greater than or equal to 50 μm and less than or equal to 200 μm. In another embodiment, the thickness 144 is greater than or equal 150 μm and less than or equal to 200 μm. Such a thickness beneficially ensures that the inorganic dielectric insulating layer 130 possesses adequate flexibility to endure stress during operation. In embodiments, the inorganic dielectric insulating layer 130 is capable of bending an amount that is greater than or equal to approximately 5% of the width 140 and less than or equal to approximately 10% of the width 140 of the high temperature semiconductor device 102 (e.g., if the high temperature semiconductor device 102 is a 5 mm square chip, the inorganic dielectric insulating layer 130 may bend by an mount greater than or equal to 25 μm and less than or equal to 50 μm).

As described herein, the phrase "locally applied" generally refers to a minimization of the extension of the inorganic dielectric insulating layer 130 beyond the outer circumferential edge 146 of the first surface 104. In the example shown, the inorganic dielectric insulating layer 130 comprises a portion 139 that extends beyond the outer circumferential edge 146. The portion 139 extends past the outer circumferential edge 146 by a distance 142. In embodiments, the distance 142 is less than or equal to a quarter of the width 140 of the first surface 104. While only one portion 139 is shown, it should be appreciated that various other locations of the inorganic dielectric insulating layer 130 may comprise other portions also extending beyond the outer circumferential edge 146 of the first surface 104. It should be appreciated that, in embodiments, such other portions are also generally limited to a quarter of the width 140 in how much they extend beyond the outer circumferential edge 146. Such localization of the inorganic dielectric insulating layer 130 is beneficial in that it limits the number of different materials (e.g., materials possessing different thermal properties) that the inorganic dielectric insulating layer 130 is in contact with. For example, in some embodiments, the inorganic dielectric insulating layer 130 may not contact the die pad 126, leads 122 and 124, and/or the lead frame 128. In some embodiments, the high temperature semiconductor device 102 and the inorganic dielectric insulating layer 130 are constructed from thermally compatible materials possessing a similar coefficients of thermal expansion (e.g., the CTE mismatch between the high temperature semiconductor device 102 and the inorganic dielectric insulating layer 130 may be less than or equal to 10 ppm/° C. and greater than or equal to 2 ppm/° C.). Such localized application minimizes thermal stress on the inorganic dielectric insulating layer 130 resulting from thermal cycling and prevents cracking and degraded electrical performance. In embodiments, an inorganic dielectric packaging material (not depicted) is disposed on the high temperature semiconductor device 102. The inorganic dielectric packaging material, for example, may cover other connections (e.g., with the leads 122 and 124) in the power device 100 to facilitate long-term reliability of such other connections. In embodiments, the inorganic dielectric packaging material is constructed of a different material than the inorganic dielectric insulating layer 130. For example, the inorganic dielectric packaging material may have a coefficient of thermal expansion that matches that of additional components (e.g., the lead frame 128) of the power device, but may have lesser dielectric strength and be external to the high voltage regions described herein.

The inorganic dielectric insulating layer 130 may take various forms depending on the implementation. For example, in the embodiment shown, the inorganic dielectric insulating layer 130 comprises an inorganic coating, a slurry-based material, or another liquid-based material applied to the first surface 104. In such embodiments, the inorganic dielectric insulating layer 130 may comprise a high temperature adhesive (e.g., an alumina phosphate-based adhesive) or a ceramic slurry. In such embodiments, wherein the inorganic dielectric insulating layer 130 comprises a liquid, slurry, and/or coating-based material, the inorganic dielectric insulating layer 130 comprises at least one of $AlPO_4$, $CaO-Al_2O_3$, $MgO-P_2O_5$, $SiO_2$, or any combination thereof.

The deposition of the inorganic dielectric insulating layer 130 onto the first surface 104 may include a deposition step followed by a curing step. For example, with respect to the deposition step, the inorganic dielectric insulating layer 130 may be applied to the first surface 104 by any application technique, though processes such as dispensing, additive manufacturing, and electrophoretic deposition may be used. After deposition of slurry-based layers, the cure process may include a drying and/or heating step to remove liquid components from the slurry followed by a high temperature sintering step. For example, in embodiments, the drying step may include a bubble removal step involving application of a vacuum to the inorganic dielectric insulating layer 130 for a predetermined period. After the bubble removal, the inorganic dielectric insulating layer 130 may be dried for a period (e.g., greater than or equal to 1 hour or less than or equal to 24 hours). After being dried, the inorganic dielectric insulating layer 130 may be cured. The curing step may involve stepped heat treatments to a final temperature. For example, in embodiments, the inorganic dielectric insulating layer 130 may first be heated to a first temperature (e.g., 100° C.), held at the first temperature for a first period (e.g., greater than or equal to 2 hours and less than or equal to 4 hours), then may be heated to a second temperature (e.g., 300° C.), held at the second temperature for a second period (e.g., greater than or equal to 2 hours and less than or equal to 4 hours), and then may be heated to a final temperature (e.g., 500° C.), and held at the final temperature for a third period (e.g., greater than or equal to 2 hours and less than or equal to four hours). In embodiments, the final temperature may correspond to a desired upper use temperature of the high temperature semiconductor device 102.

The inorganic dielectric insulating layer 130 may also, in addition to a coating or slurry-based material, comprise a solid insulating layer (not shown) to provide higher and more uniform dielectric strength compared with the coating or slurry-based materials alone. For example, the solid insulating layer may possess less porosity or air gaps compared to coatings or other liquid-based materials applied to the first surface 104. Such a solid insulating layer may be disposed on the coating or slurry-based inorganic dielectric insulating layer 130. In other words, the inorganic dielectric insulating layer 130 may constitute a bonding layer for bonding the solid insulating layer to the first surface 104. The solid insulating layer may comprise a glass-based dielectric material, a ceramic, or a composite material. In embodiments, the inorganic dielectric insulating layer 130 comprises a plurality of inorganic dielectric insulating layers. In embodiments, at least two of the plurality of inorganic dielectric insulating layers are constructed of different material or possess different material properties. For example, a first layer of the inorganic dielectric insulating layer 130 disposed directly on the high temperature semiconductor device 102 may possess a coefficient of thermal coefficient that most closely matches the high temperature semiconductor device 102. Additional layers of the inorganic dielectric insulating layer 130 disposed on the first layer in this example may possess coefficients of thermal expansion that match the high temperature semiconductor device to a lesser extent than the first layer (e.g., the plurality of layers within the inorganic dielectric insulating layer 130 may possess a gradient of dielectric properties). In embodiments, the plurality of layers of the inorganic dielectric insulating layer 130 may be formed of the same material. Such a multi-layer construction may reduce the formation of bubbles in the inorganic dielectric insulating layer 130. In embodiments, the multi-layer construction of the inorganic dielectric insulating layer 130 is due to application of the inorganic dielectric insulating layer 130 via an additive manufacturing process (e.g., multiple passes of a print head).

The inorganic dielectric insulating layer 130 is generally capable of withstanding sustained operation at temperatures greater than or equal to 200° C. (e.g., greater than or equal to 200° C., greater than or equal to 250° C., greater than or equal to 300° C., greater than or equal to 350° C., greater than or equal to 400° C., greater than or equal to 450° C., or even greater than or equal to 500° C.). In some embodiments, the dielectric insulating layer 130 is capable of withstanding sustained operation at temperatures that exceed the operational limit of the high temperature semiconductor device 102 (e.g., temperatures less than or equal to 2000° C.). To facilitate high power use cases for the power device 100, the inorganic dielectric insulating layer 130 may also be adapted to block high voltages of 1000V or more to prevent voltage breakdown of the power device 100. For example, in one embodiment, the power device 100 is capable of sustained operation at up to 2000V at 500° C. Such sustained operation of the power device 100 is facilitated by the inorganic dielectric insulating layer 130 having a relatively low porosity. For example, in embodiments, the inorganic dielectric insulating layer 130 has a packing volume that is greater than or equal to 70% (e.g., achieved through curing the inorganic dielectric insulating layer 130 and through material selection). As a further benefit, the inorganic dielectric insulating layer 130 enhances the ability of the power device 100 to withstand operation at higher altitudes by occupying the high voltage region 118, rendering the power device less susceptible to breakdown in low pressure environments.

While the inorganic dielectric insulating layer 130 is depicted as covering an entirety of the first surface 104 and also comprising the portions 139 extending beyond the outer circumferential edge 146, it should be appreciate that alternative structures are contemplated. For example, in one embodiment, the inorganic dielectric insulating layer 130 may not comprise the portions 139 extending beyond the outer circumferential edge 146, but may still cover the entire first surface 104. In other embodiments, portions of the first surface 104 are not covered by the inorganic dielectric insulating layer 130. The inorganic dielectric insulating layer 130 may only be needed at locations corresponding high electric field regions or junction termination points within the device layer 134. As such, in some embodiments, the inorganic dielectric insulating layer 130 only extends through the high voltage region 118 proximate to the first surface 104. For example, in some embodiments, the inorganic dielectric insulating layer 130 only extends over the termination region 108 of the high temperature semiconductor device 102. Such embodiments beneficially minimize the quantity of insulation material used per device, saving on production costs.

In some embodiments, the inorganic dielectric insulating layer 130 may extend over the termination region 108 and a portion of the active region 106 of the high temperature semiconductor device 102. In such embodiments, the inorganic dielectric insulating layer 130 may cover all of the active region 106 except for a portion thereof used to form an electrical connection with a contact disposed on the active region 106 (e.g., to allow space for the source wire 138 to be connected to the source contact 116 in the shown example).

Figure 2:
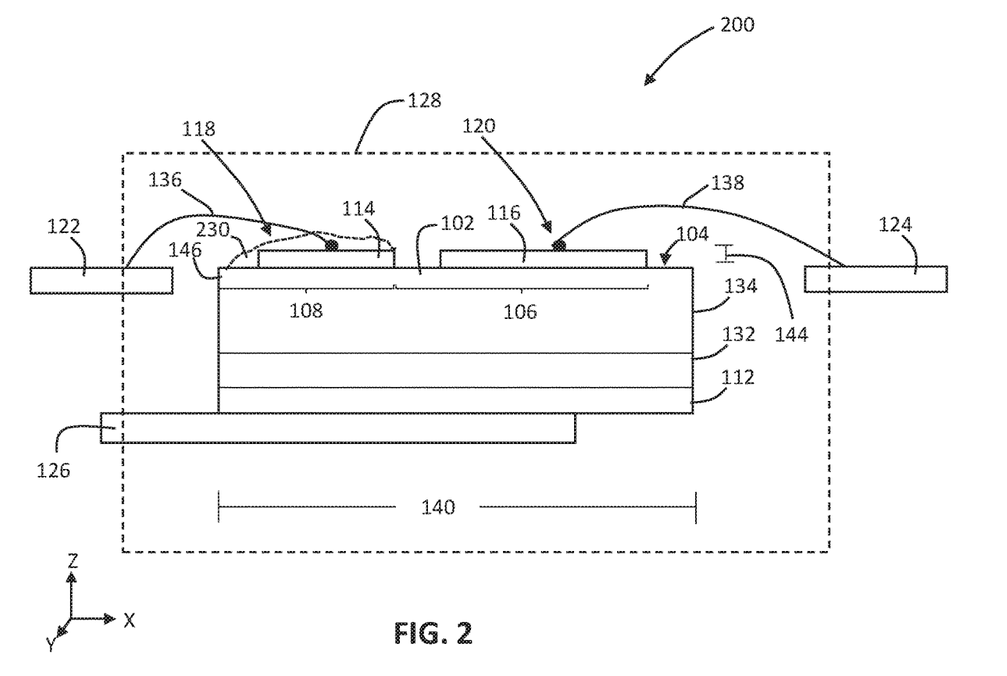
FIG. 2 schematically depicts a power device comprising an inorganic dielectric insulating layer, according to one or more embodiments described herein.

Referring now to FIG. 2, a schematic of a power device 200 is shown. The power device 200 may be similar to the power device 100 described with respect to FIG. 1 herein. Accordingly, like reference numerals are used where appropriate to indicate the incorporation of similar components. Power device 200 comprises an inorganic dielectric insulating layer 230 that differs from the dielectric insulating layer 130 described with respect to FIG. 1. The inorganic dielectric insulating layer 230 differs from the inorganic dielectric insulating layer 130 in that inorganic dielectric insulating layer 230 does not extend over the entirety of the first surface 104. In this embodiment, the inorganic dielectric insulating layer 230 only extends over the termination region 108. In embodiments, various portions of the inorganic dielectric insulating layer 230 may extend over various regions of the first surface 104 depending on the underlying operation of the high temperature semiconductor device 102. For example, the inorganic dielectric insulating layer 230 may be selectively deposited on the first surface 104 only to cover the termination region 108 where relatively high electric fields are present above the first surface 104 (e.g., near the corners of locally doped regions), for example, when the high temperature semiconductor device 102 is placed under a reverse bias. As such, the inorganic dielectric insulating layer 230 may have a plurality of geometries depending on the underlying implementation of the high temperature semiconductor device 102.

The inorganic dielectric insulating layer 230 shown in FIG. 2 may be a high temperature adhesive (e.g., an alumina phosphate-based adhesive) or a ceramic slurry applied to the first surface 104 after electrical connection of the gate and source wires 136 and 168 to the gate and source contacts 114 and 116. The entirety of the inorganic dielectric insulating layer 230 is disposed on the first surface 104. In other words, the inorganic dielectric insulating layer 230 does not comprise portions that extend beyond the outer circumferential edge 146 of the first surface 104 in the example depicted. A comparison of the inorganic dielectric insulating layer 230 of FIG. 2 and the inorganic dielectric insulating layer 130 of FIG. 1 indicates a variation in the amount of the first surface 104 that the locally applied insulations described herein may cover while still providing adequate voltage blocking capabilities at elevated temperatures.

Figure 3:
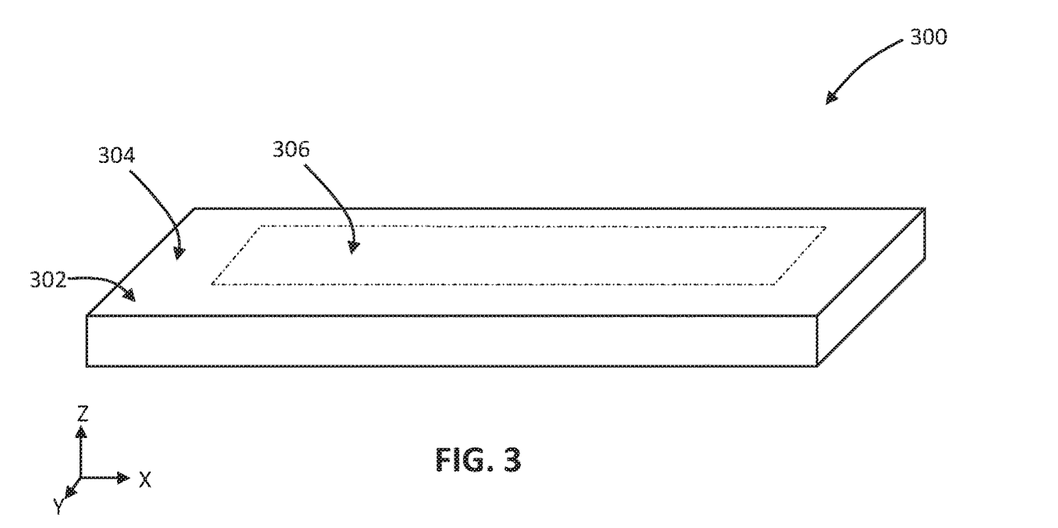
FIG. 3 depicts a perspective view of a high temperature semiconductor device, according to one or more embodiments described herein.

Referring now to FIG. 3, a perspective view of a high temperature semiconductor device 300 is shown, according to an example embodiment. In some embodiments, the high temperature semiconductor device 300 comprises a silicon carbide-based MOSFET device. The high temperature semiconductor device 300 generally comprises similar features as the high temperature semiconductor device 102 described herein with respect to FIG. 1. Although the high temperature semiconductor device 300 is depicted as rectangular, it should be appreciated that the present disclosure is applicable to semiconductor device having any three-dimensional shape.

The high temperature semiconductor device 300 comprises a first surface 302. The high temperature semiconductor device 300 generally comprises a central active region 304 and an outer termination region 306 that circumferentially surrounds the central active region 304. For example, active region 304 may comprise a plurality of doped regions (e.g., p-wells, n+ regions disposed in the p-wells, and a p+ body, all disposed in an n-drift layer) adapted to form a conductive area on application of a threshold voltage (e.g., to a gate electrode) to the high temperature semiconductor device 300. Termination region 306 generally comprises areas where p-n junctions within the thigh temperature semiconductor device 300 terminate and areas containing other doping region discontinuities. High electric fields are generally present in the termination region 306 when the high temperature semiconductor device 300 is subjected to a bias voltage. The active region 304 is generally free of such discontinuities that lead to generation of such high electric fields. Various specifics of the structure of high temperature semiconductor device 300 are omitted for purposes of clarifying the discussion herein. For example, in some embodiments, the first surface 302 comprises gate electrodes extending over the termination region 306. Such gate electrodes may be disposed on inter-layer dielectrics and/or gate oxides disposed on a device layer.

As described herein, generation of such high electric fields within the termination region 306 creates the possibility for device breakdown, which creates the need for electrical insulation to be applied to the high temperature semiconductor device 302. Such electrical insulation is particularly beneficial in cases where the high temperature electrical device is below a certain size (e.g., 5 mm by 5 mm), meaning that junction terminations are particularly close together.

Figure 4:
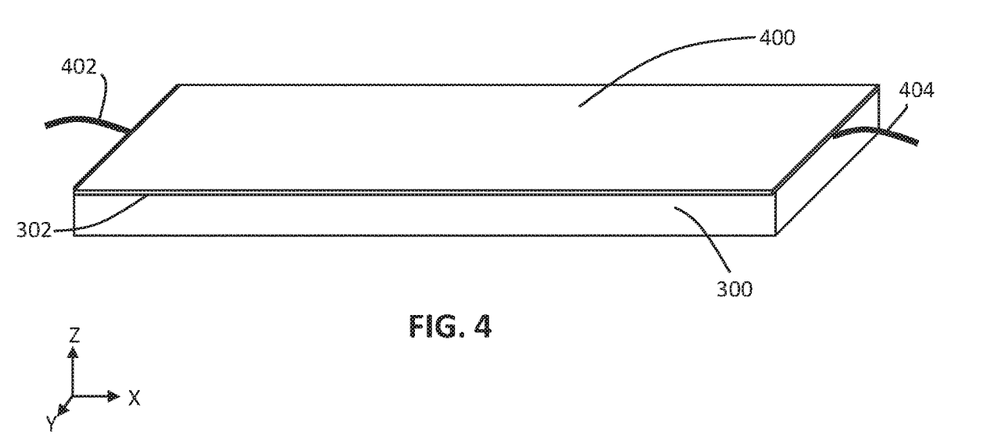
FIG. 4 depicts a perspective view of a high temperature semiconductor device comprising an inorganic dielectric insulating layer, according to one or more embodiments described herein.

Referring now to FIG. 4, a perspective view of the high temperature semiconductor device 300 having an inorganic dielectric insulating layer 400 disposed directly on the first surface 302 is shown, according to one embodiment. In the example shown, the inorganic dielectric insulating layer 400 covers an entirety of the first surface 302 and is largely coextensive with the first surface 302. The inorganic dielectric insulating layer 400 may be a cement (e.g., a calcium aluminate cement, a phosphate cement), a ceramic (e.g., an aluminium phosphate ceramic), or a composite material. For example, in embodiments, the inorganic dielectric insulating layer 400 comprises a liquid, slurry, and/or coating-based material, the inorganic dielectric insulating layer 400 comprises at least one of $AlPO_4$, $CaO$—$Al_2O_3$, $MgO$—$P_2O_5$, $SiO_2$, or any combination thereof. In such embodiments, the inorganic dielectric insulating layer 400 may be deposited via the vacuum bubble removal, drying, and curing steps described herein.

In various embodiments, the inorganic dielectric insulating layer 400 possesses a thickness from about 50 µm to about 200 µm. The inorganic dielectric insulating layer 400 covers the termination region 306 such that voltage breakdowns of the high temperature semiconductor device 300 are prevented. The inorganic dielectric insulating layer 400 is shown to cover wire connections 402 and 404 attached to components (e.g., a source contact, gate contacts) at the first surface 302. In implementations where the inorganic dielectric insulating layer 400 is a coating, cement, or other liquid-based material first applied to the first surface 302 and then hardened, such wire connections 402 and 404 may be attached to the first surface 302 prior to application of the coating. In such implementations, the inorganic dielectric insulating layer 400 covers the entirety of the first surface 302, excepting regions already covered by portions of the wire connections 402 and 404 in contact with the first surface 302. In certain implementations, the high temperature semiconductor device 300 may be attached to additional packaging components (e.g., leads, die pads, a lead frame) prior to application of the inorganic dielectric insulating layer 400.

In embodiments, the inorganic dielectric insulating layer 400 may not cover the entirety of the first surface 302. For example, in embodiments, the inorganic dielectric insulating layer 400 may cover only the termination region 306. In embodiments, the inorganic dielectric insulating layer 400 may cover the termination region 306 and only a portion of the active region 304. In still other embodiments, the inorganic dielectric insulating layer 400 may cover only a portion of the termination region 306. For example, certain areas within the termination region 306 depicted in FIG. 3 may not possess junction discontinuities that lead to the relatively high electric fields in regions adjacent to the first surface 302. In embodiments, the inorganic dielectric insulating layer 400 may only cover high voltage regions disposed immediately adjacent to areas of the first surface 302 containing such discontinuities. The placement of such discontinuities will depend on the particular implementation of the high temperature semiconductor device 300. As such, the minimal coverage of the first surface 302 necessary to prevent voltage breakdown will vary depending on the doping configuration of the high temperature semiconductor device 302.

In embodiments, wire connections 402 and 404 may be connected to the first surface 302 after the inorganic dielectric insulating layer 400 is deposited on the first surface 302. In such embodiments, portions of the first surface 304 containing elements (e.g., contacts) to be connected to components external to the high temperature semiconductor device 302 are not covered by the inorganic dielectric insulating layer 400. In other words, the inorganic dielectric insulating layer 400 may be deposited so as to selectively cover portions of the first surface 302 not needing external connections. Such a patterned deposition of the inorganic dielectric insulating layer 400 may be performed in a variety of ways. For example, in embodiments, the inorganic dielectric insulating layer 400 may be deposited on the first surface 302 via an additive manufacturing technique.

Figure 5:
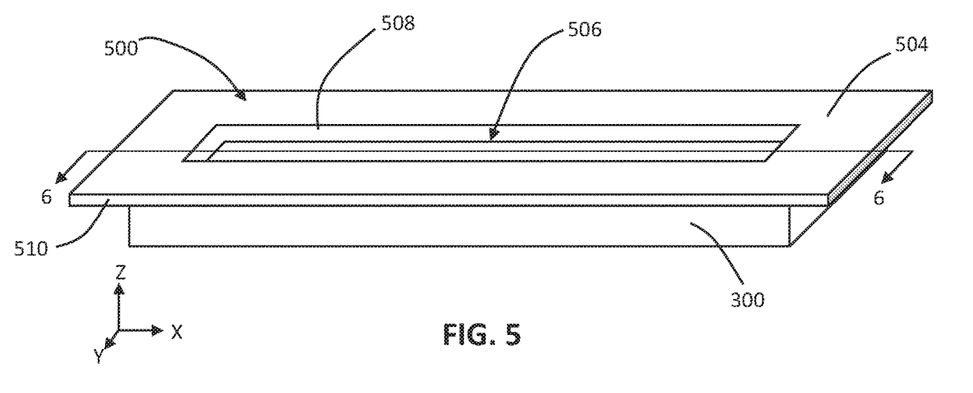
FIG. 5 depicts a perspective view of a high temperature semiconductor device comprising an inorganic dielectric insulating window and a bonding layer, according to one or more embodiments described herein.
Figure 6:
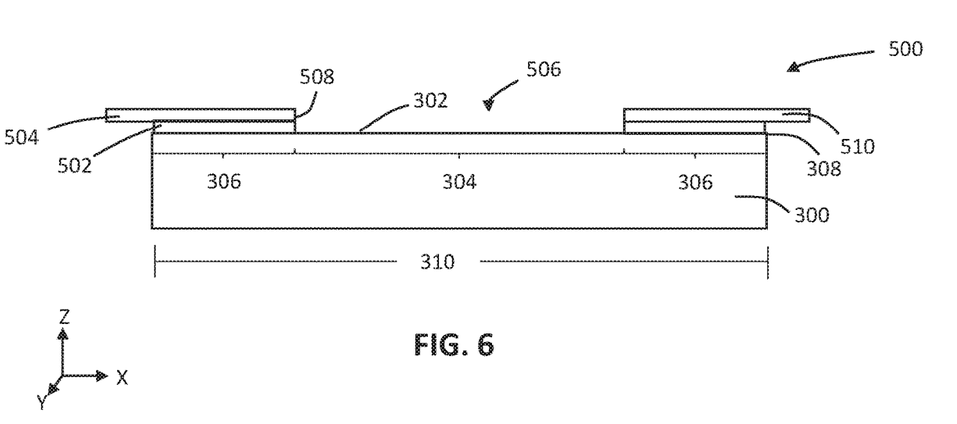
FIG. 6 depicts a cross-sectional view of the high temperature device semiconductor device shown in FIG. 5, according to one or more embodiments described herein.

Referring now to FIGS. 5-6, different views of a high temperature semiconductor device 300 having an inorganic dielectric insulating layer 500 disposed directly on the first surface 302 are shown, according to embodiments. FIG. 5 depicts a perspective view of the high temperature semiconductor device 302 having the inorganic dielectric insulating layer 500 disposed thereon, while FIG. 6 depicts a cross-sectional view at the line 6-6 shown in FIG. 5. The inorganic dielectric insulating layer 500 comprises a bonding layer 502 and a solid insulation layer 504. In various embodiments, the bonding layer 502 comprises a coating, cement, or slurry-based inorganic dielectric, similar to the inorganic dielectric coating layer 400 described with respect to FIG. 4. For example, in one embodiment, the bonding layer 502 comprises an alumina phosphate adhesive applied to the first surface 302 of the high temperature semiconductor device 300.

In embodiments, the solid insulation layer 504 is constructed of a glass, ceramic, or composite material. In one embodiment, the solid insulation layer 504 is constructed of 99% pure alumina. In embodiments, a lower purity alumina, such as 96% pure alumina, may be used to facilitate adhesion to the high temperature semiconductor device 300. Generally, in embodiments, the solid insulation layer 504 may be constructed from a material comprising a dielectric strength of greater than or equal to 10 kV/mm and less than or equal to 35 kV/mm. In embodiments, ceramics may be used for the solid insulation layer 504 because of their relatively low porosity and high dielectric strength. In some embodiments, a combined thickness of the bonding layer 502 and the solid insulation layer 504 is between 25 µm and 500 µm, with the solid insulation layer 504 having a greater thickness than the bonding layer 502. For example, in embodiments, the bonding layer 502 may comprise a thickness that is greater than or equal to 5 µm and less than or equal to 25 µm. This way, the solid insulation layer 504 (e.g., possessing greater dielectric strength than the bonding layer 502) may be used for a majority of the voltage blocking. For example, in one embodiment, the solid insulation layer 504 is approximately 80 µm thick.

The solid insulation layer 504 may be pre-formed to a desired shape, positioned with respect to the high temperature semiconductor device 300, and then pressed against the first surface 302. The bonding layer 502 may then be allowed to cure (e.g., through a drying period or via application of a curing agent such as UV radiation) to complete the localized deposition of the inorganic dielectric insulating layer 500 to the first surface 302. For example, in embodiments where the solid insulation layer 504 comprises a glass window, a pre-formed glass article may be cut (e.g., through laser processing, chemical etching, or any other known glass cutting technique) to have a desired shape (e.g., comprise an opening 506) and then disposed on the first surface 302 at a desired position. It should be appreciated that, while the solid insulation layer 504 is shown to be concentrically disposed upon the high temperature semiconductor device 300, this is not the case in accordance with various alternative embodiments.

Addition of the solid insulation layer 504 beneficially enables the insulating layer to be larger than the high temperature semiconductor device 300, which may further limit the potential for surface voltage breakdown. For example, as shown, solid insulation layer 504 comprises a cantilevered portion 510 that extends beyond the outer circumferential edge 308 of the first surface 302. In various embodiments, the cantilevered portion 510 extends beyond the outer circumferential edge 308 so as to minimize contact of the solid insulation layer 504 with other components of a system incorporating the high temperature semiconductor device 300 to facilitate reliable operation at elevated temperatures. In embodiments, the solid insulation layer 504 may not comprise the cantilevered portion 510. For example, in embodiments, the solid insulation layer 504 may be substantially flush with the outer circumferential edge 308 of the first surface 302. In another example, an exterior edge of the solid insulation layer 504 may be disposed inward of the circumferential edge 308.

Solid insulation layer 504 comprises an opening 506 extending through an entirety of the thickness thereof. The opening 506 facilitates formation of electrical connections with various components (e.g., gate contacts, source contacts, etc.) at the first surface 302 of the high temperature semiconductor device 300. For example, wire bonds or the like may be formed with a source contact at the first surface 302 after the solid insulation layer 504 is disposed on the first surface 302. An inner surface 508 of the solid insulation layer 504 is shown to define a circumferential boundary of the opening 506. In the example shown, the inner surface 508 is disposed over an internal boundary of the termination region 306 such that that solid insulation layer 504 covers the entirety of the termination region 306 and none of the active region 304. In alternative embodiments, the solid insulation layer 504 and bonding layer 502 may cover a portion of the active region 304. While the solid insulation layer 504 is shown to comprise a single opening 506, it should be appreciated that the solid insulation layer 504 may comprise multiple openings (e.g., each opening may be for a separate electrical connection) in accordance with various alternative embodiments.

Figure 7:
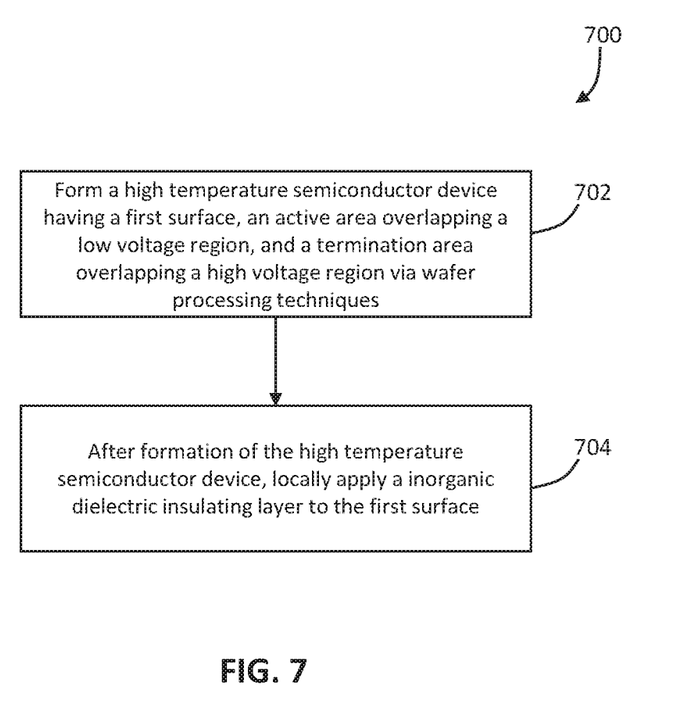
FIG. 7 depicts a method of forming an insulated high temperature semiconductor device, according to one or more embodiments described herein.

Referring now to FIG. 7, a flow diagram of a method 700 of locally applying an inorganic dielectric insulating layer to a semiconductor device is shown, according to at least one embodiment. At step 702 a high temperature semiconductor device is formed. For example, conventional wafer processing techniques may be used to form various layers possessing various types and concentrations of dopants on a semiconductor substrate. The ultimate configuration and layout of such dopant concentrations depends on the type and configuration of the semiconductor device formed. For example, in various embodiments, the high temperature semiconductor device is a MOSFET device formed on a semiconductor substrate. Generally such a device may comprise a device layer disposed on a semiconductor substrate. The device layer may comprise various doping regions to form various components of the MOSFET device (e.g., the source region, the gate region, and the drain region). As an example as to how wafer processing techniques may be used to form the high temperature semiconductor device, see U.S. Pat. Nos. 10,347,489 and 10,243,039, hereby incorporated by reference in their entireties.

As described herein, the high temperature semiconductor device formed at step 702 generally comprises a first surface, an active area, and a termination area. The first surface may comprise a surface of the device layer as well as any additional components (e.g., metallization layers, contacts, gate oxide layers, dielectric layers, passivation layers) formed thereon. The active area generally forms a conductive layer upon application of a voltage to the high temperature semiconductor device enabling the high temperature semiconductor device to conduct electricity. The termination area generally comprises ends of various doping regions formed in the device layer. Such doping discontinuities in the termination area generally lead to relatively high electric fields in a high voltage region disposed adjacent to the termination area. Since the active area generally lacks such discontinuities, a low voltage region is disposed adjacent to the first surface immediately proximate to the active area. Such high electric fields in the high voltage region create the potential for voltage breakdown of the high temperature semiconductor device, especially when operating at high voltages (e.g., 1000V or more) and a size of the high temperature semiconductor device (e.g., the distance between terminations) is 5 mm or less.

In a step 704, after formation of the high temperature semiconductor device, an inorganic dielectric insulating layer is locally applied to the first surface of the high temperature semiconductor device. Generally, the inorganic dielectric insulating layer is capable of withstanding repeated operation at elevated temperatures of 200° C. or more. In some embodiments, the inorganic dielectric insulating layer is capable of withstanding repeated operation at elevated temperatures of 500° C. or more. The inorganic dielectric insulating layer may also be capable of blocking high voltages of 1000V or 2000V or more. For example, in various embodiments, the inorganic dielectric insulating layer is an inorganic coating. In some embodiments, the inorganic dielectric insulating layer is a ceramic slurry. In some embodiments, the inorganic dielectric insulating layer comprises a solid insulation layer constructed of a glass, ceramic, or composite material in addition to an inorganic coating or ceramic slurry-based bonding layer.

As will be appreciated, the manner in which the inorganic dielectric insulating layer is applied to the first surface will vary depending on the form of the inorganic dielectric insulating layer. For example, in embodiments where the inorganic dielectric insulating layer is an inorganic coating, the inorganic dielectric insulating layer may be applied to the first surface via a dip coating, spin coating, or other coating technique. Any known application technique may be used to deposit the inorganic dielectric insulating layer on the first surface. Embodiments incorporating the solid insulation layer may also comprise shaping (e.g., cutting, grinding, polishing) the solid insulation layer, positioning the shaped insulation layer with respect to the high temperature semiconductor device, pressing the solid insulation layer to the first surface, and curing the bonding layer. It should also be appreciated that the inorganic dielectric insulating layer may be deposited before or after the high temperature semiconductor device is deposited into packaging and/or electrical connections are formed between the high temperature semiconductor devices and any additional components.

The inorganic dielectric insulating layer generally extends through the high voltage region adjacent to the termination area of the high temperature semiconductor device so as to prevent voltage breakdown of the high temperature semiconductor device. Beneficially, the local application of the inorganic dielectric insulating layer facilitates long-term operation of the high temperature semiconductor device at elevated temperatures by preventing crack formation resulting from thermal incompatibilities of the inorganic dielectric insulating layer with other materials in the packaging of the high temperature.

In view of the foregoing description, it should be understood that local application of an inorganic dielectric insulating layer to a first surface of a high temperature semiconductor device beneficially reduces the potential of voltage breakdown of the high temperature semiconductor device. This is especially beneficial for reduced-size (e.g., less than 5 mm) semiconductor devices, which possess other beneficial qualities such as reduced device-level resistance. Additionally, constructing the inorganic dielectric insulating layer of a high temperature capable material, such as an inorganic coating, a ceramic slurry, an alumina-based cement, a glass, and/or a composite material that does not sublimate or burn when exposed to elevated temperatures of 200° C. or more beneficially facilities the operation of the high temperature semiconductor device at such elevated temperatures. Locally applying the inorganic dielectric insulating layer to the first surface after formation of the semiconductor device facilitates adequate insulation thickness for voltage breakdown protection. Such local application thus expands the capabilities of high temperature semiconductor devices to elevated temperature applications such as power conversion and electrical actuation (e.g., within internal combustion or electric motors).

Further aspects of the invention are provided by the subject matter of the following clauses:

1. A device comprises: a high temperature semiconductor device comprising a first surface, wherein the high temperature semiconductor device comprises an active area and a termination area disposed adjacent to the active area; an inorganic dielectric insulating layer disposed on the first surface, wherein the inorganic dielectric insulating layer fills a volume extending over an entirety of the termination area and comprises a thickness greater than or equal to 50 µm and less than or equal to 200 µm; and an electrical connector connecting the active area of the high temperature semiconductor device to an additional component of the device.

2. The device of any preceding clause, wherein the high temperature semiconductor device comprises a wide bandgap semiconductor substrate.

3. The device of any preceding clause, further comprising an inorganic dielectric packaging material disposed on the high temperature semiconductor device, wherein the inorganic dielectric packaging material is constructed of a different material than the inorganic dielectric insulating layer.

4. The device of any preceding clause, wherein the high temperature semiconductor device has a width in a direction perpendicular to a surface normal of the first surface, wherein the inorganic dielectric insulating layer extends over a circumferential edge of the first surface by less than or equal to a quarter of the width.

5. The device of any preceding clause, wherein the inorganic dielectric insulating layer comprises an inorganic coating.

6. The device of any preceding clause, wherein the inorganic coating covers an entirety of the first surface and the electrical connector.

7. The device of any preceding clause, wherein the inorganic dielectric insulating layer comprises a plurality of inorganic dielectric insulating layers, wherein at least two of the plurality of inorganic dielectric insulating layers possess different material properties.

8. The device of any preceding clause, wherein the inorganic dielectric insulating layer further comprises a dielectric window component bonded to the first surface by the inorganic coating.

9. The device of any preceding clause, wherein the inorganic coating comprises at least one of $AlPO_4$, $CaO$—$Al_2O_3$, $MgO$—$P_2O_5$, $SiO_2$, or any combination thereof.

10. The device of any preceding clause, wherein the inorganic dielectric insulating layer comprises a ceramic slurry.

11. The device of any preceding clause, wherein the inorganic dielectric insulating layer comprises a dielectric strength of greater than or equal to 10 kV/mm and less than or equal to 35 kV/mm.

12. A device comprises: a high temperature semiconductor device comprising a first surface; a high voltage region disposed adjacent to the first surface; a low voltage region disposed adjacent to the first surface and offset from the high voltage region; and an inorganic dielectric insulating layer disposed on the first surface in the high voltage region, wherein the first surface has a width in a direction perpendicular to a surface normal of the first surface, wherein the inorganic dielectric insulating layer comprises a portion that extends over a circumferential edge of the first surface, wherein the portion is less than or equal to a quarter of the width of the first surface.

13. The device of any preceding clause, wherein the inorganic dielectric insulating layer comprises a thickness of greater than or equal to 50 µm and less than or equal to 200 µm.

14. The device of any preceding clause, wherein the inorganic dielectric insulating layer comprises a dielectric strength of greater than or equal to 10 kV/mm and less than or equal to 35 kV/mm.

15. The device of any preceding clause, wherein the inorganic dielectric insulating layer comprises an inorganic coating.

16. The device of any preceding clause, wherein the inorganic coating covers an entirety of the first surface.

17. The device of any preceding clause, wherein the high temperature semiconductor device comprises a central active area and a termination area surrounding the central active area, wherein the inorganic dielectric insulating layer covers an entirety of the termination area.

18. The device of any preceding clause, wherein the inorganic dielectric insulating layer further comprises a dielectric window component bonded to the first surface by the inorganic coating, wherein the dielectric window comprises an opening extending over the central active area.

19 The device of any preceding clause, wherein the inorganic dielectric insulating layer comprises a ceramic slurry.

20. A method comprises: depositing an inorganic dielectric insulating layer on a pre-formed high temperature semiconductor device, wherein: the high temperature semiconductor device comprises a first surface; the high temperature semiconductor device comprises an active area and a termination area disposed adjacent to the active area; the inorganic dielectric insulating layer is deposed on the first surface such that the inorganic dielectric insulating layer overlaps the termination area; and the inorganic dielectric insulating layer comprises a dielectric strength of greater than or equal to 10 kV/mm and less than or equal to 35 kV/mm.

It will be apparent to those skilled in the art that various modifications and variations can be made to the embodiments described herein without departing from the spirit and scope of the claimed subject matter. Thus, it is intended that the specification cover the modifications and variations of the various embodiments described herein provided such modification and variations come within the scope of the appended claims and their equivalents.

What is claimed is:

1. A device comprising:
a high temperature semiconductor device comprising a first surface, wherein the high temperature semiconductor device comprises an active area and a termination area disposed adjacent to the active area;
an inorganic dielectric insulating layer disposed on the first surface, wherein the inorganic dielectric insulating layer fills a volume extending over an entirety of the termination area and comprises a thickness greater than or equal to 50 μm and less than or equal to 200 μm; and
an electrical connector connecting the active area of the high temperature semiconductor device to an additional component of the device.

2. The device of claim 1, wherein the high temperature semiconductor device comprises a wide bandgap semiconductor substrate.

3. The device of claim 1, further comprising an inorganic dielectric packaging material disposed on the high temperature semiconductor device, wherein the inorganic dielectric packaging material is constructed of a different material than the inorganic dielectric insulating layer.

4. The device of claim 1, wherein the high temperature semiconductor device has a width in a direction perpendicular to a surface normal of the first surface, wherein the inorganic dielectric insulating layer extends over a circumferential edge of the first surface by less than or equal to a quarter of the width.

5. The device of claim 1, wherein the inorganic dielectric insulating layer comprises an inorganic coating.

6. The device of claim 5, wherein the inorganic coating covers an entirety of the first surface and the electrical connector.

7. The device of claim 5, wherein the inorganic dielectric insulating layer comprises a plurality of inorganic dielectric insulating layers, wherein at least two of the plurality of inorganic dielectric insulating layers possess different material properties.

8. The device of claim 5, wherein the inorganic dielectric insulating layer further comprises a dielectric window component bonded to the first surface by the inorganic coating.

9. The device of claim 8, wherein the inorganic coating comprises at least one of $AlPO_4$, $CaO$—$Al_2O_3$, $MgO$—$P_2O_5$, $SiO_2$, or any combination thereof.

10. The device of claim 1, wherein the inorganic dielectric insulating layer comprises a ceramic.

11. The device of claim 1, wherein the inorganic dielectric insulating layer comprises a dielectric strength of greater than or equal to 10 kV/mm and less than or equal to 35 kV/mm.

12. A device comprising:
a high temperature semiconductor device comprising a first surface;
a high voltage region disposed adjacent to the first surface;
a low voltage region disposed adjacent to the first surface and offset from the high voltage region; and
an inorganic dielectric insulating layer disposed on the first surface in the high voltage region, wherein the first surface has a width in a direction perpendicular to a surface normal of the first surface, wherein the inorganic dielectric insulating layer comprises a portion that extends over a circumferential edge of the first surface, wherein the portion is less than or equal to a quarter of the width of the first surface.

13. The device of claim 12, wherein the inorganic dielectric insulating layer comprises a thickness of greater than or equal to 25 μm and less than or equal to 500 μm.

14. The device of claim 12, wherein the inorganic dielectric insulating layer comprises a dielectric strength of greater than or equal to 10 kV/mm and less than or equal to 35 kV/mm.

15. The device of claim 12, wherein the inorganic dielectric insulating layer comprises an inorganic coating.

16. The device of claim 15, wherein the inorganic coating covers an entirety of the first surface.

17. The device of claim 15, wherein the high temperature semiconductor device comprises a central active area and a termination area surrounding the central active area, wherein the inorganic dielectric insulating layer covers an entirety of the termination area.

18. The device of claim 17, wherein the inorganic dielectric insulating layer further comprises a dielectric window component bonded to the first surface by the inorganic coating, wherein the dielectric window comprises an opening extending over the central active area.

19. The device of claim 12, wherein the inorganic dielectric insulating layer comprises a ceramic slurry.

* * * * *